US009620589B2

(12) United States Patent
Sassiat et al.

(10) Patent No.: US 9,620,589 B2
(45) Date of Patent: Apr. 11, 2017

(54) INTEGRATED CIRCUITS AND METHODS OF FABRICATION THEREOF

(71) Applicant: GLOBALFOUNDRIES, Inc., Grand Cayman (KY)

(72) Inventors: Nicolas Sassiat, Dresden (DE); Ran Yan, Dresden (DE); Kun-Hsien Lin, Dresden (DE); Jan Hoentschel, Dresden (DE)

(73) Assignee: GLOBALFOUNDRIES, INC., Grand Cayman (KY)

( * ) Notice: Subject to any disclaimer, the term of this patent is extended or adjusted under 35 U.S.C. 154(b) by 55 days.

(21) Appl. No.: 14/246,983

(22) Filed: Apr. 7, 2014

(65) Prior Publication Data

US 2015/0287782 A1    Oct. 8, 2015

(51) Int. Cl.
| | |
|---|---|
| *H01L 27/12* | (2006.01) |
| *H01L 29/06* | (2006.01) |
| *H01L 21/306* | (2006.01) |
| *H01L 21/308* | (2006.01) |

(52) U.S. Cl.
CPC ...... *H01L 29/0673* (2013.01); *H01L 21/3083* (2013.01); *H01L 21/30608* (2013.01)

(58) Field of Classification Search
CPC ...................................................... B82Y 10/00
See application file for complete search history.

(56) References Cited

U.S. PATENT DOCUMENTS

| | | | |
|---|---|---|---|
| 2006/0212977 A1* | 9/2006 | Otis | ................ B82Y 10/00 700/90 |
| 2011/0127614 A1 | 6/2011 | Scheiper et al. | |
| 2012/0153402 A1 | 6/2012 | Kronholz et al. | |
| 2012/0161238 A1 | 6/2012 | Scheiper et al. | |
| 2012/0211838 A1 | 8/2012 | Kronholz et al. | |
| 2013/0175585 A1 | 7/2013 | Tan et al. | |
| 2013/0248985 A1 | 9/2013 | Amarnath et al. | |
| 2013/0299922 A1 | 11/2013 | Choi et al. | |
| 2013/0299994 A1 | 11/2013 | Park et al. | |
| 2013/0320450 A1 | 12/2013 | Hoentschel et al. | |

(Continued)

OTHER PUBLICATIONS

U.S. Appl. No. 14/144,062, Entitled, "Methods for Fabricating Multiple-Gate Integrated Circuits", Dec. 30, 2013, 23 pages.

*Primary Examiner* — Zandra Smith
*Assistant Examiner* — Andre' C Stevenson
(74) *Attorney, Agent, or Firm* — Lorenz & Kopf, LLP

(57) ABSTRACT

Integrated circuits and methods for fabricating integrated circuits are provided. In an embodiment, a method includes providing a semiconductor substrate, defining a length on the semiconductor substrate corresponding to opposing vertices of a nanowire, removing a portion of the semiconductor substrate to provide a first fin structure and a second fin structure, etching a first cavity proximate to the first side, depositing a protective layer in the first cavity, removing a portion of the protective layer to expose a portion of the semiconductor substrate, and etching a second cavity at the exposed semiconductor substrate where the first and second cavities communicate. The first and second fin structures are adjacent where the length of the first fin structure corresponds to the opposing vertices and has a first side and a second side.

2 Claims, 7 Drawing Sheets

(56) References Cited

U.S. PATENT DOCUMENTS

2014/0217502 A1\* 8/2014 Chang ............... H01L 29/78
  257/347
2014/0225065 A1\* 8/2014 Rachmady ........ H01L 29/42392
  257/24

\* cited by examiner

INTEGRATED CIRCUITS AND METHODS OF FABRICATION THEREOF

TECHNICAL FIELD

The present invention generally relates to integrated circuits and methods of fabrication thereof, and more particularly relates to integrated circuits having one or more nanowires and methods of fabrication thereof.

BACKGROUND

The majority of present day integrated circuits can be implemented by using a plurality of interconnected field effect transistors (FETs), also called metal oxide semiconductor field effect transistors (MOSFETs), or simply MOS transistors. Often, a typical MOS transistor includes a gate electrode as a control electrode formed over a semiconductive substrate, and spaced apart source and drain electrodes within the substrate between which a current can flow. A control voltage applied to the gate electrode may control the flow of current through a channel in the semiconductive substrate between the source and drain electrodes. Usually, dielectric materials, such as silicon dioxide, are commonly employed to electrically separate the various gate electrodes in the integrated circuit.

Typically, the reduction in the size of MOSFETs has provided continued improvement in speed performance, circuit density, and cost per unit function over the past few decades. As the gate length of the conventional bulk MOSFET is reduced, however, the source and drain electrodes increasingly can interact with the channel and gain influence on the channel potential. Consequently, a transistor with a short gate length may suffer from problems related to the inability of the gate electrode to substantially control the on and off states of the channel. Generally, phenomena such as reduced gate control associated with transistors with short channel lengths are termed "short-channel effects." Increased substrate doping concentration, reduced gate oxide thickness, and shallow source/drain junctions may be ways to suppress short-channel effects. However, for device scaling into the sub-50 nanometer (nm) regime, the requirements for doping concentration, gate oxide thickness, and source/drain doping profiles often become increasingly difficult to meet.

Typically, shrinkage of the length and width of the device is the implemented method for reducing the device footprint. Generally, other solutions such as three-dimensional stacking of multiple physical layers of transistors using several substrates is still in its infancy and has mechanical, positional and thickness issues requiring solutions.

Accordingly, it is desirable to provide methods for fabricating integrated circuits having nanowires. In addition, it is desirable to provide integrated circuits with nanowires to more efficiently utilize the semiconductor substrate and reduce the integrated circuit footprint. Furthermore, other desirable features and characteristics of the present invention will become apparent from the subsequent detailed description of the invention and the appended claims, taken in conjunction with the accompanying drawings and this background of the invention.

BRIEF SUMMARY

Integrated circuits and methods for fabricating integrated circuits are provided. In accordance with an exemplary embodiment, a method is provided for fabricating an integrated circuit. The method includes providing a semiconductor substrate, defining a length on the semiconductor substrate corresponding to opposing vertices of a nanowire, removing a portion of the semiconductor substrate to provide a first fin structure and a second fin structure, etching a first cavity proximate to the first side, depositing a protective layer in the first cavity, removing a portion of the protective layer to expose a portion of the semiconductor substrate, and etching a second cavity at the exposed semiconductor substrate where the first and second cavities communicate. The first and second fin structures are adjacent where the length of the first fin structure corresponds to the opposing vertices and has a first side and a second side.

In accordance with another exemplary embodiment, a method is provided for fabricating an integrated circuit. The method includes providing a semiconductor substrate, defining a length on the semiconductor substrate corresponding to opposing vertices of a nanowire, removing a portion of the semiconductor substrate to provide a first fin structure and a second fin structure, etching a first cavity proximate to the first side, etching a second cavity proximate to the second side and adjacent to the first cavity and communicating therewith, depositing a protective layer in the first and second cavities, removing a portion of the protective layer to expose a portion of the semiconductor substrate in both the first and second cavities, etching a third cavity at the exposed semiconductor substrate in the first cavity, and etching a fourth cavity at the exposed semiconductor substrate in the second cavity. The first and second fin structures are adjacent where the length of the first fin structure corresponds to the opposing vertices of a nanowire and has a first side and a second side, and the first, second, third, and fourth cavities define the nanowire having opposing vertices with the defined length.

In accordance with a further exemplary embodiment, an integrated circuit is provided. The integrated circuit includes a gate side, a source side, a drain side, a bulk side, and a plurality of nanowires aligned substantially vertical. The plurality of nanowires has a first end at the source side and a second end at the drain side, and define a distance of no more than about 28 nm.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. Furthermore, there is no intention to be bound by any theory presented in the preceding background or the following detailed description.

Conventional techniques related to semiconductor device fabrication are well known and, so for the sake of brevity, many such steps may not be described in detail herein. Moreover, the various tasks and process steps described herein may be incorporated into a more comprehensive procedure or process having additional steps or functionality not described in detail herein. In particular, various steps in the manufacture of semiconductor-based transistors are well known and so, in the interest of brevity, many conventional steps will only be mentioned briefly herein or will be omitted entirely without providing the well-known process details.

Figure 1:
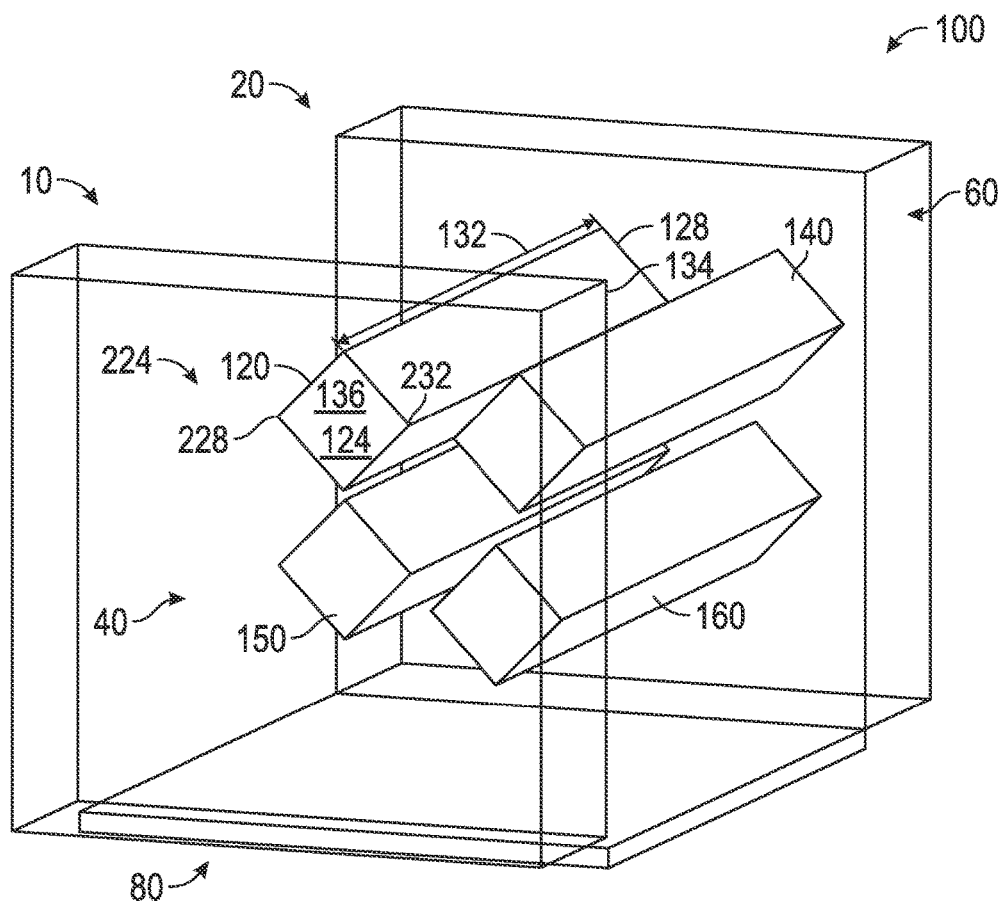
FIG. 1 is a perspective view of an integrated circuit according to an exemplary embodiment with a source side and drain side depicted in phantom.

Referring to FIG. 1, an exemplary integrated circuit 10, is depicted. The integrated circuit 10 has a gate side 20, a source side 40, a drain side 60, and a bulk side 80. In addition, the integrated circuit 10 can include one or more nanowires 100, preferably a plurality of nanowires 100. The one or more nanowires 100 can be supported on either end by the source side 40 and the drain side 60. In this exemplary embodiment, four nanowires, namely a first nanowire 120, a second nanowire 140, a third nanowire 150, and a fourth nanowire 160 are depicted, but the exemplary integrated circuit 10 may include any suitable number of nanowires. If a plurality of nanowires 100 is present, each nanowire of the plurality can be aligned in a stack forming a substantially vertical wall of nanowires with each wire orientated substantially horizontal. Several stacks of nanowires may be formed, independently, either in parallel with one another or skewed. Although each stack has two nanowires, any number, such as three, four, or five, of nanowires may be stacked and any suitable number of stacked rows or walls may be formed. Forming the nanowires 100 from a substrate can reduce the size of the integrated circuit footprint by providing improved drive current per unit area by utilizing the substrate's depth, instead of forming additional structures in addition to the substrate.

In this exemplary embodiment, each nanowire 120, 140, 150, and 160 of the one or more nanowires 100 is substantially identical to one another. So, only the first nanowire 120 will be described in detail. However, in other exemplary embodiments, the nanowires 120, 140, 150, and 160 may be different from one another. The first nanowire 120 has a first end 124 and a second end 128 and forms a substantial prism shape 134. Typically, the first nanowire 120 has a cross-section with a substantial diamond shape 136. The first nanowire can also have opposing vertices 224, namely a first vertice 228 and a second vertice 232. The shape and cross-section are determined by the method of manufacture, as hereinafter described, and may vary depending on the manufacturing method. The first nanowire 120 can extend a distance 132, indicated by double-headed arrow 132, from the first end 124 to the second end 128, which typically corresponds to the distance between the source side 40 and the drain side 60 and is no more than about 28 nm. The nanowire 120 can include materials from a semiconductor substrate from which it is formed, as hereinafter described.

Figure 2:
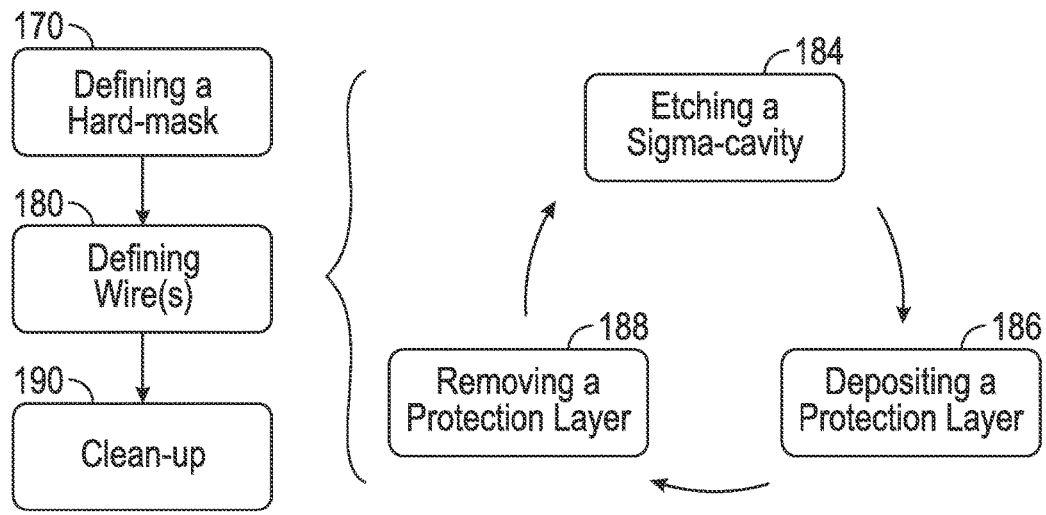
FIG. 2 is a process flow diagram of a method for fabricating an integrated circuit.

Referring to FIG. 2, in an exemplary embodiment, manufacturing the one or more nanowires involves at least three steps, namely defining a hard-mask 170, defining wire(s) 180, and clean-up 190. The step of defining wire(s) 180 can further include etching a sigma-cavity 184, depositing a protection layer 186, and removing a protection layer 188. Optionally, protection layer(s) provided before sigma-cavity etching may be removed. Moreover, the protection layer 188 can be opened using any suitable method, such as anisotropic dry etching.

Referring to FIGS. 3-14, a manufacturing method is depicted for making an integrated circuit in accordance with an exemplary embodiment. As hereinafter described, the cavities can be formed in horizontal rows with each row produced at a different depth. Alternatively, cavities may be formed one underneath another before proceeding to the next column of cavities. It should be understood that the identification of cavities, i.e., first, second, third, etc., may be made in the order of fabrication. Thus, the identification of cavities in the specification may differ from those defined in the claims.

Figure 3:
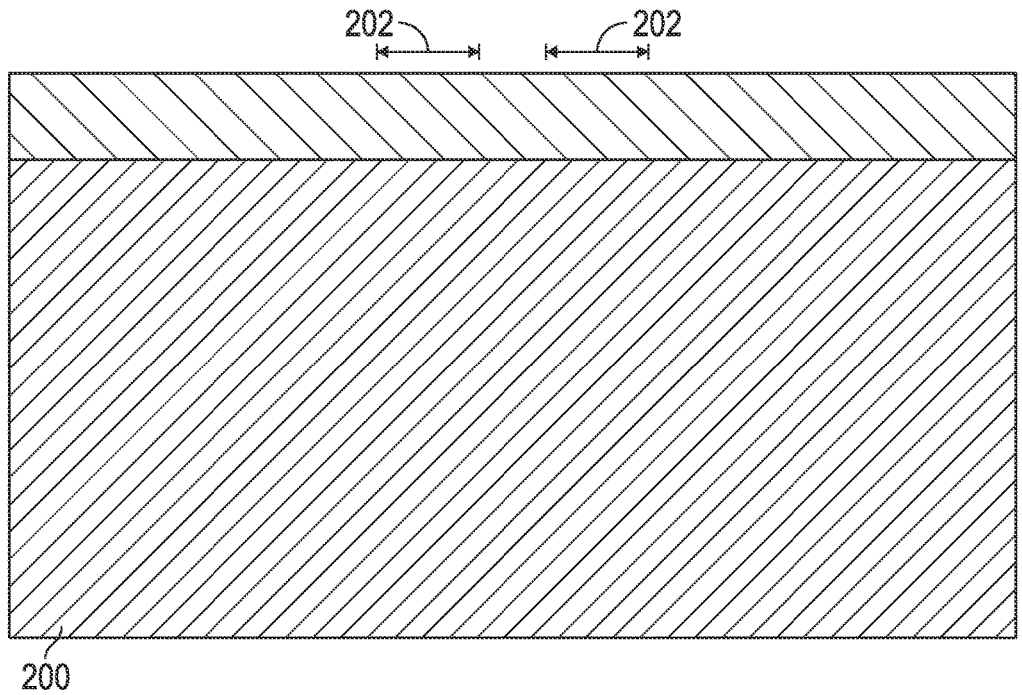
FIGS. 3-14 illustrate, in cross-section, an integrated circuit and a method for fabricating the integrated circuit according to an exemplary embodiment.

Referring to FIG. 3, a semiconductor substrate 200 is depicted. Arrows 202 are provided defining areas omitted from a protective or a hard-mask for etching the semiconductor substrate 200 for forming fin structures defining their respective length as well as a space between opposing vertices of a nanowire, hereinafter described. The length 202 may be defined by "FinFET" techniques, as hereinafter described. The semiconductor substrate is formed from a semiconductor material. As used herein, the term "semiconductor substrate" will be used to encompass semiconductor materials conventionally used in the semiconductor industry from which to make electrical devices. Semiconductor materials include monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. The semiconductor material is preferably a silicon substrate. The silicon substrate may be a bulk silicon wafer or may be a thin layer of silicon on insulating layer (commonly known as silicon-on-insulator or SOI) that, in turn, is supported by a carrier wafer. A horizontal line is also provided on the semiconductor substrate 200 that merely defines the depth of a trench for defining two fin structures, as hereinafter described.

Figure 4:
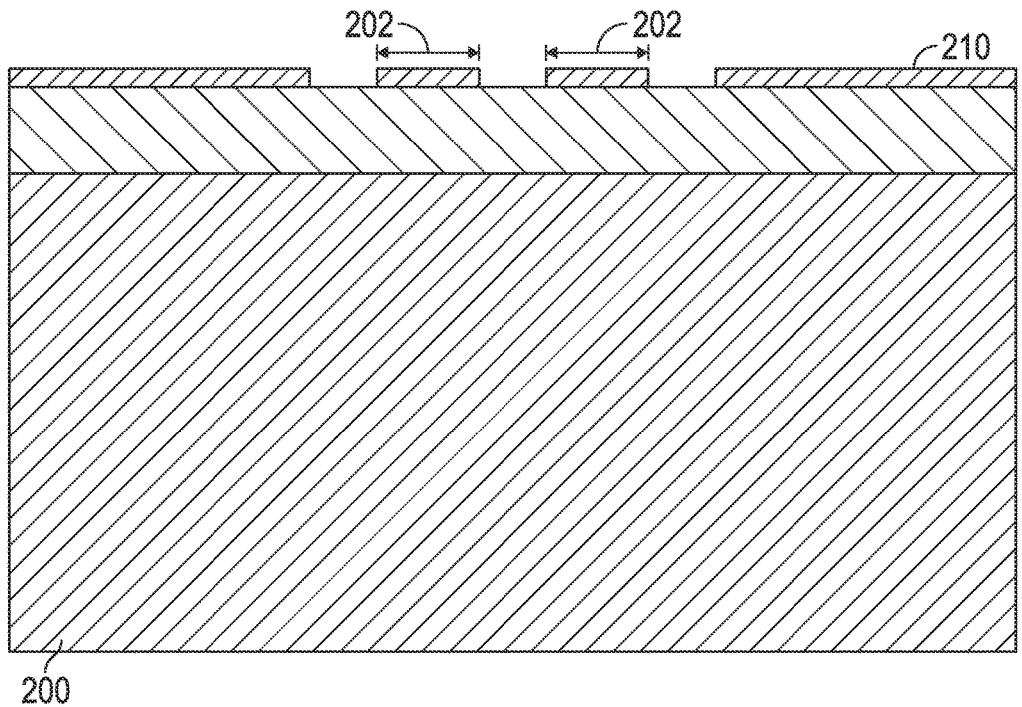

Referring to FIG. 4, a patterned mask layer 210, such as a patterned hard mask layer, is patterned above the semiconductor substrate 200 using known photolithography and etching techniques. Generally, the patterned mask layer 210 is intended to be representative in nature as it could include a variety of materials, such as, for example, a photoresist material, silicon nitride, silicon oxynitride, or silicon dioxide. The patterned mask layer 210 may be formed by performing a variety of known processing techniques, such as a chemical vapor deposition (CVD) process, an atomic layer deposition (ALD) process, or plasma enhanced versions of such processes, and the thickness of such a layer 210 may vary depending upon the particular application. In one illustrative embodiment, the patterned mask layer 210 is a hard mask layer of silicon nitride that is initially formed by performing a CVD process and thereafter patterned using known sidewall image transfer techniques and/or photolithographic techniques combined with performing known etching techniques.

Figure 5:
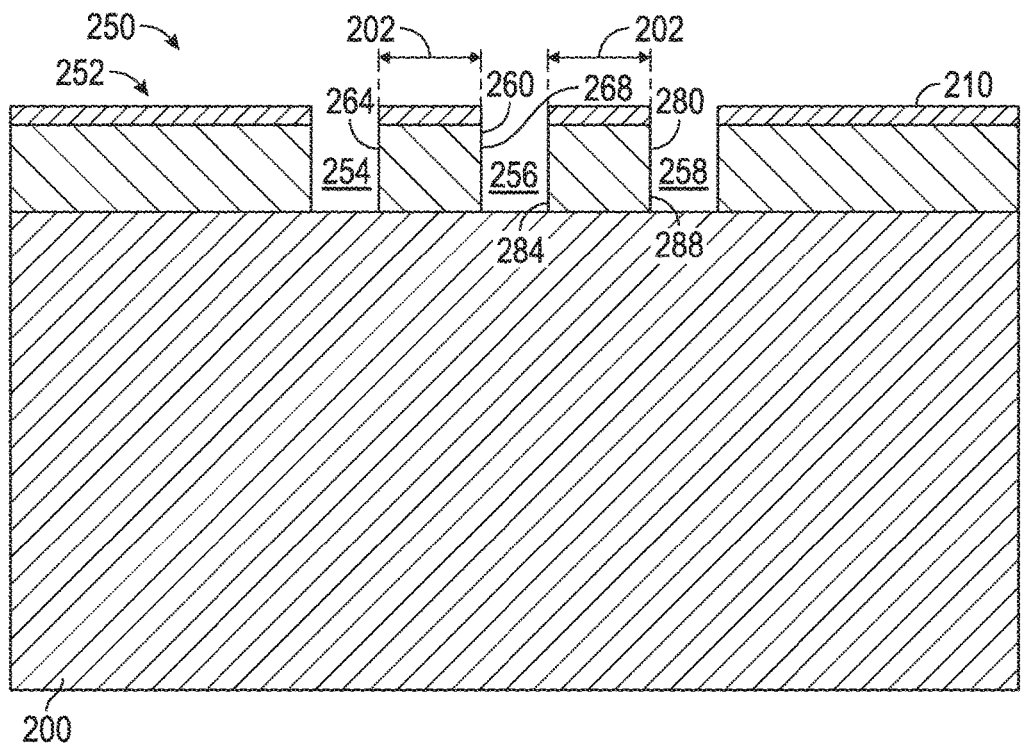

Referring to FIG. 5, typically an etching process, such as a dry or wet etching process, is performed on the semiconductor substrate 200 using the patterned mask layer 210 to form a plurality of trenches 252, namely a first trench 254, a second trench 256, and a third trench 258, defining a plurality of fin structures 250 including a first fin structure 260 and a second fin structure 280. These fin structures 260 and 280 can be formed similarly to a "FinFET" semiconductor device, which typically takes its name from the multiple thin silicon "fins" that are used to form the respective gate channels. The length 202 can be ascertained using any suitable methodology used to form FinFET structures so as to correspond to the desired space between opposing vertices of a nanowire. The overall size, shape, and configuration of the trenches 252 and fin structures 250 may vary depending on the particular application. The depth and width of the trenches 252 may vary depending upon the particular application. In one illustrative embodiment, the depth of the trenches 252 may be, independently, from about 5 to about 28 nm and the width of the trenches 252 may be, independently, from about 5 nm to about 28 nm.

In this exemplary embodiment, the fin structures 260 and 280 and the trenches 254, 256, and 258 are of uniform shape and size, so only the first fin structure 260 will be described in detail hereinafter. However, it should be understood that the fin structures 260 and 280 and trenches 254, 256, and 258 may not be a uniform size and shape in other embodiments. Moreover, the trenches 254, 256, and 258 may have a rounded configuration. The first fin structure 260 can include a first side 264 and a second side 268. Sides 264 and 268 define the opposing vertices of the nanowire 120, as hereinafter described. The second fin structure 280 may also include a first side 284 and a second side 288.

Figure 6:
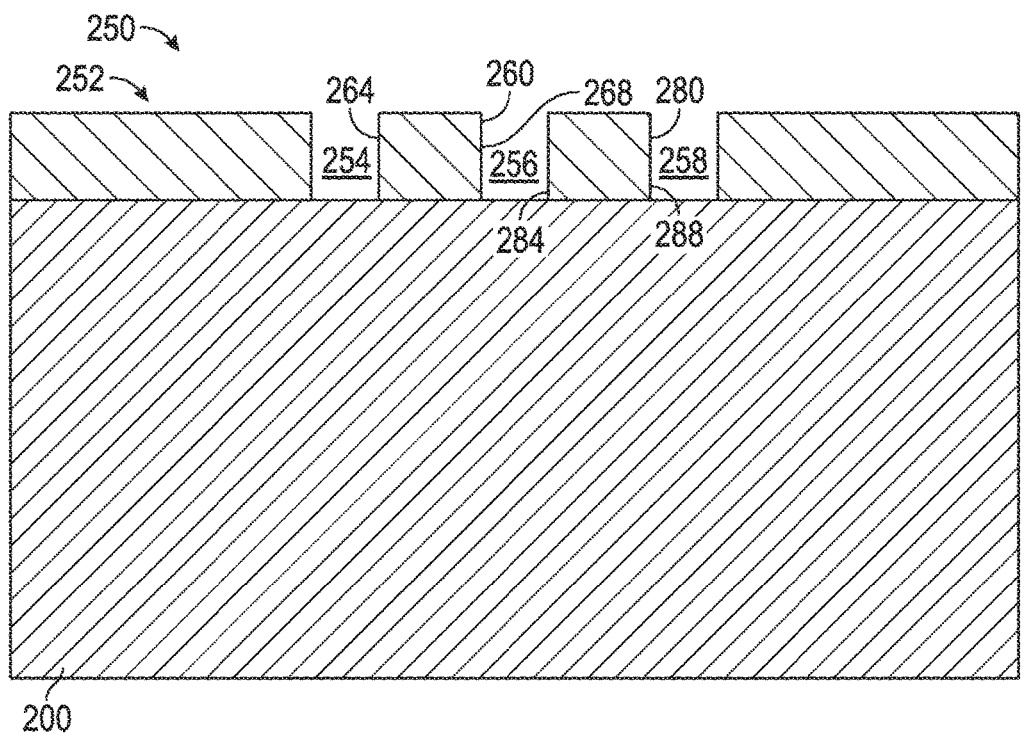

Referring to FIG. 6, the patterned mask layer 210 may optionally be removed using any suitable conventional method, such as one or more etching processes. In other exemplary embodiments, the patterned mask layer 210 may be left until further processing is conducted.

Figure 7:
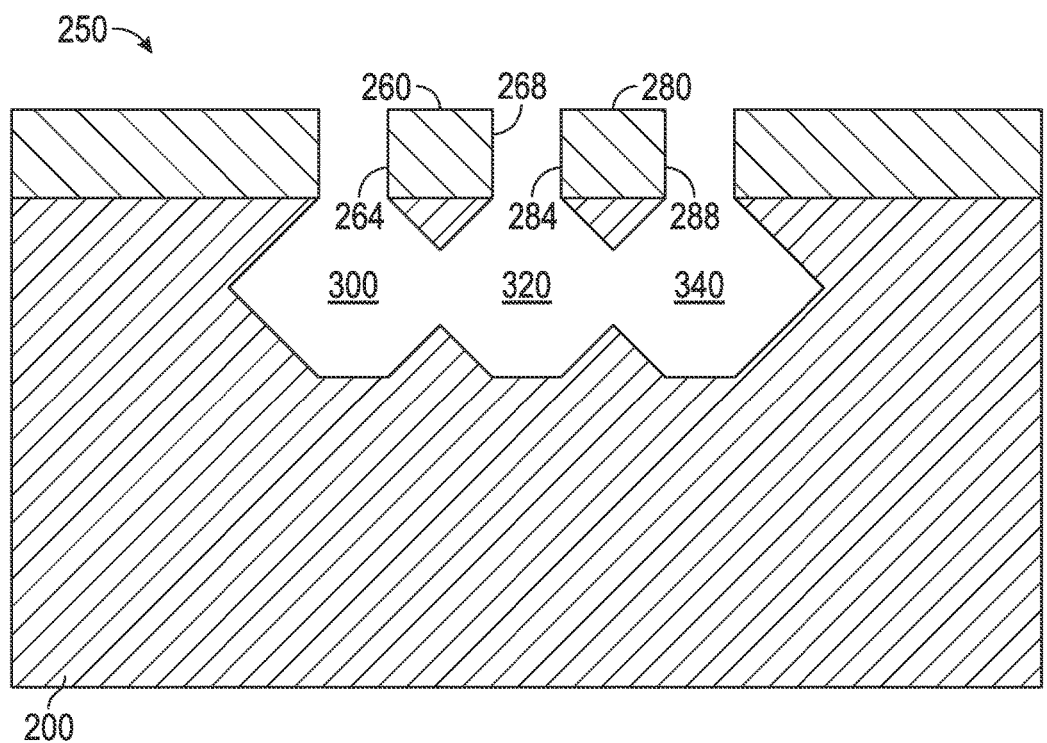

Referring to FIG. 7, a first cavity 300, a second cavity 320, and a third cavity 340 are formed at the sides 264 and 268 of the first fin structure 260, and the sides 284 and 288 of the second fin structure 280. The cavities 300, 320, and 340 can be formed by any suitable process, including anisotropic wet etching process. The etching process may be performed on the basis of a wet chemical etch recipe having a crystallographically-anisotropic etch behavior when applied to silicon. That is, the chemical etch recipe may be provided such that the etch rate depends on the crystallographic orientation of crystal planes of the silicon. Several such anisotropic wet etchants may be provided for etching silicon in the manner noted above, substantially all of them including hot aqueous caustic solutions of, e.g., potassium hydroxide (KOH) or tetramethylammonium hydroxide (TMAH). Other processes may include an isotropic etch chemistry. Generally, the cavities 300, 320, and 340 are sigma cavities. Exemplary sigma cavities and methods of fabrication are disclosed in, e.g., U.S. Patent Publication No. 2013/0175585.

Figure 8:
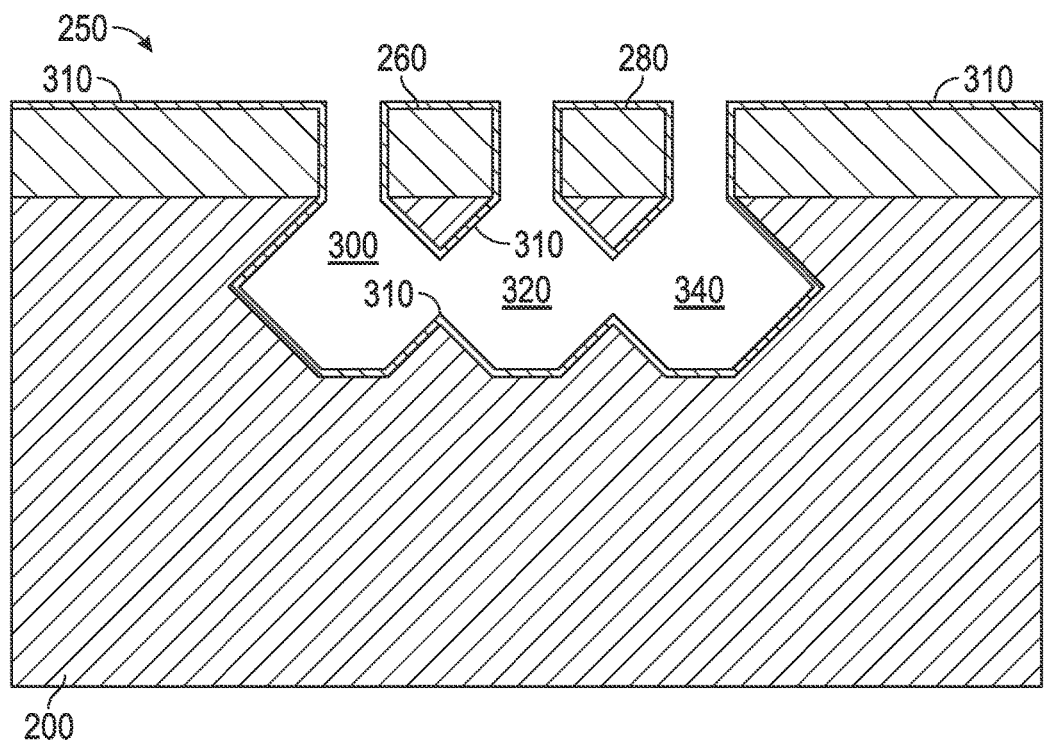
Figure 9:
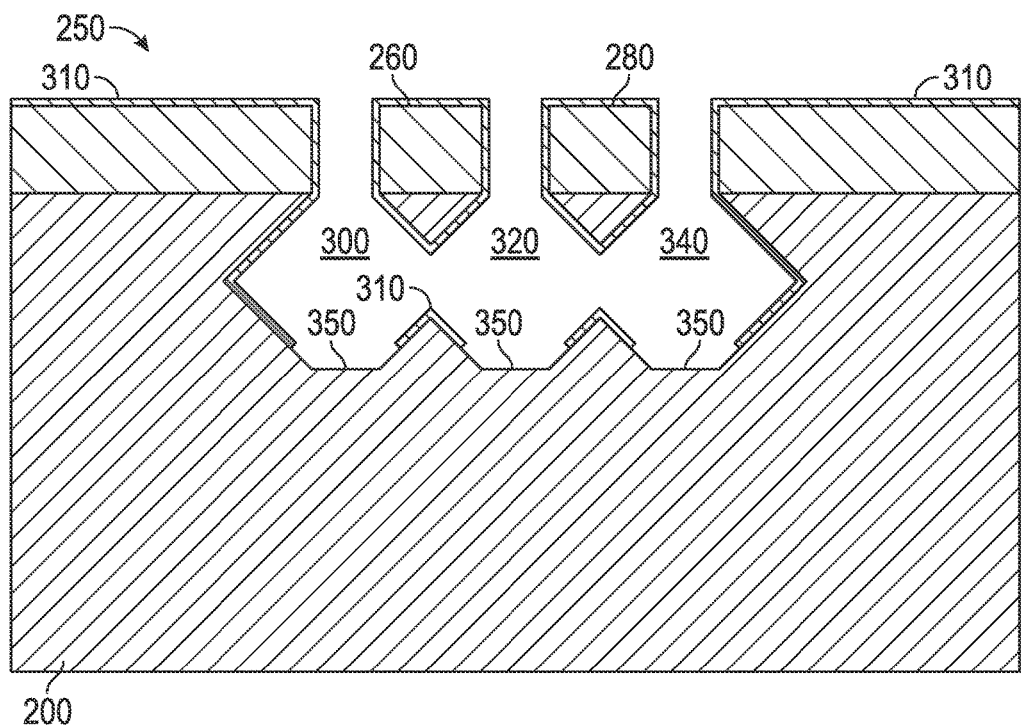

Referring to FIGS. 8-9, in an exemplary embodiment, a protective layer 310 is applied to the semiconductor substrate 200, including the cavities 300, 320, and 340. The protective layer 310 can be applied by atomic layer deposition (ALD), although any suitable method may be used. Referring to FIG. 9, the protective layer 310 at the bottom portions 350 of the cavities 300, 320, and 340 can be removed by any suitable process, such as by anisotropic dry etching. Generally the bottom portions 350 are removed at the bottom of the cavities 300, 320, and 340.

Figure 10:
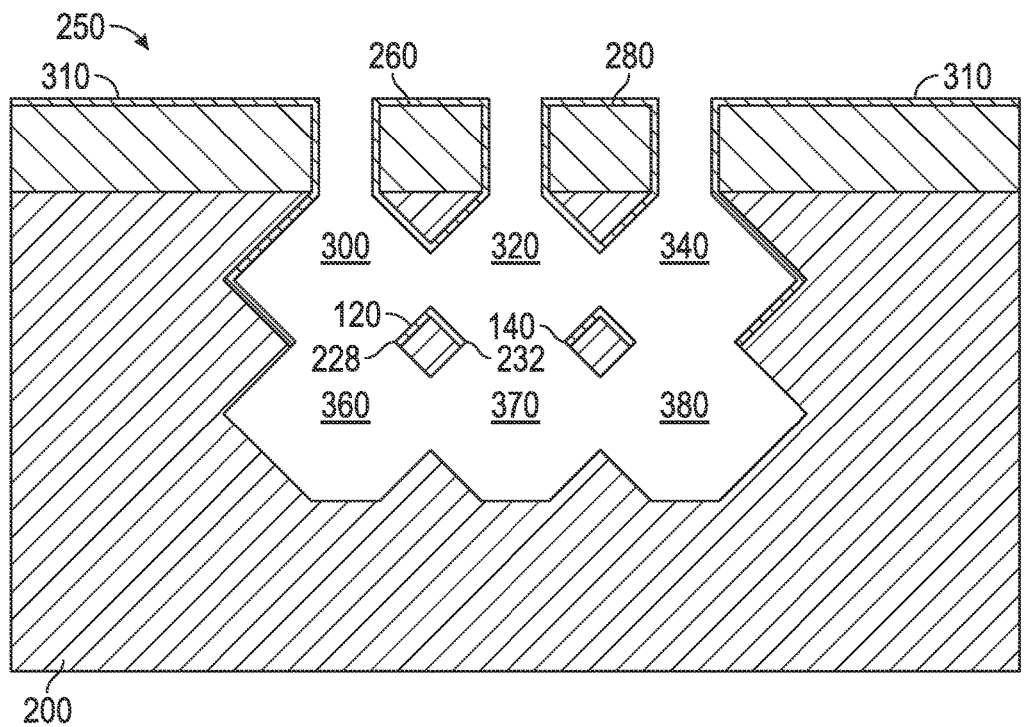

Referring to FIG. 10, following removal of bottom portions of the protective layers 310, more cavities, such as sigma cavities, can be formed at the exposed portions of the substrate, as described above. These cavities can be a fourth cavity 360, a fifth cavity 370, and a sixth cavity 380. Generally, the cavities can communicate with one another. Particularly, the first cavity 300 can communicate with the adjacent second cavity 320, in turn communicating with the adjacent cavity 340. Similarly, the cavity 360 can communicate with the adjacent the cavity 370, and in turn with the adjacent cavity 380. Additionally, the first cavity 300 can communicate with the cavity 360 below, the cavity 320 can communicate with the cavity 370 below, and the cavity 340 can communicate with the cavity 380 below. Alternatively, the cavities can, independently, approach one another without communicating as long as, preferably, a nanowire is defined.

Four of the cavities can define a nanowire. In this exemplary embodiment, the cavities 300, 320, 360, and 370 define the nanowire 120 and the cavities 320, 340, 370, and 380 define the nanowire 140. The vertices 228 and 232 of the nanowire 120 can correspond to the length 202 of the fin structure 260 as depicted in FIG. 3. In this exemplary embodiment, a first row of cavities 300, 320, and 340 are etched at a first depth, and a second row of cavities 360, 370, and 380 are etched at a second depth. However, cavities can be etched vertically in columns by, e.g., etching the first cavity 300 and then subsequently etching another cavity 360 below. Afterwards, an adjacent cavity 320 to the cavity 300 may be etched and subsequently the cavity 370 below.

Figure 11:
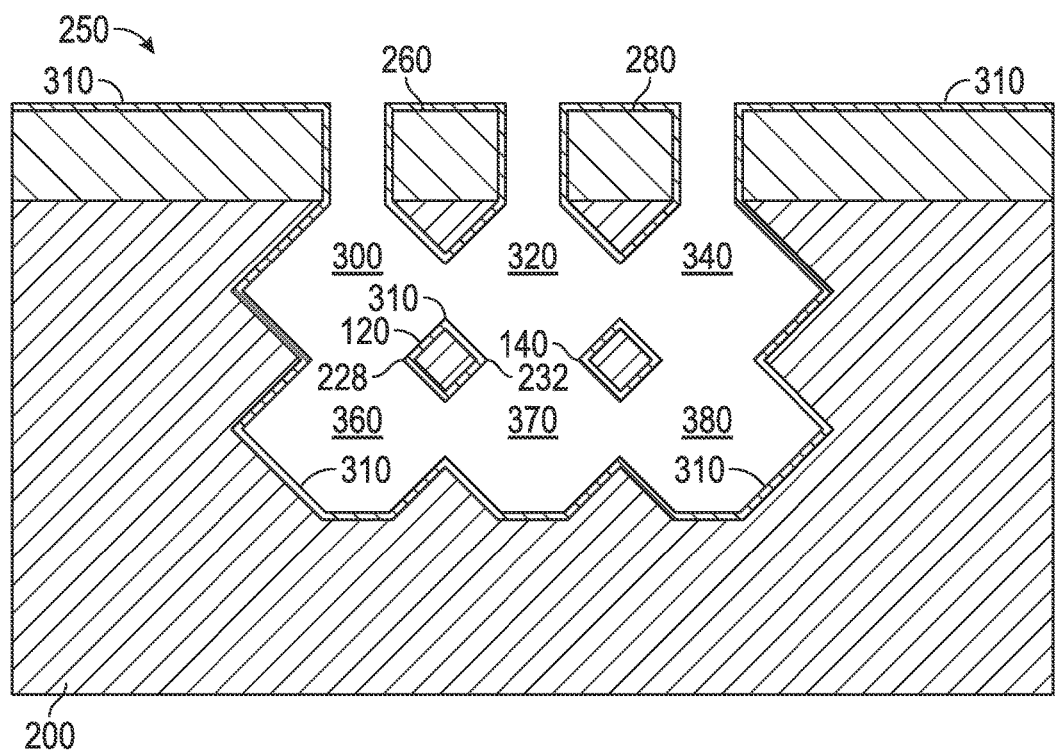
Figure 12:
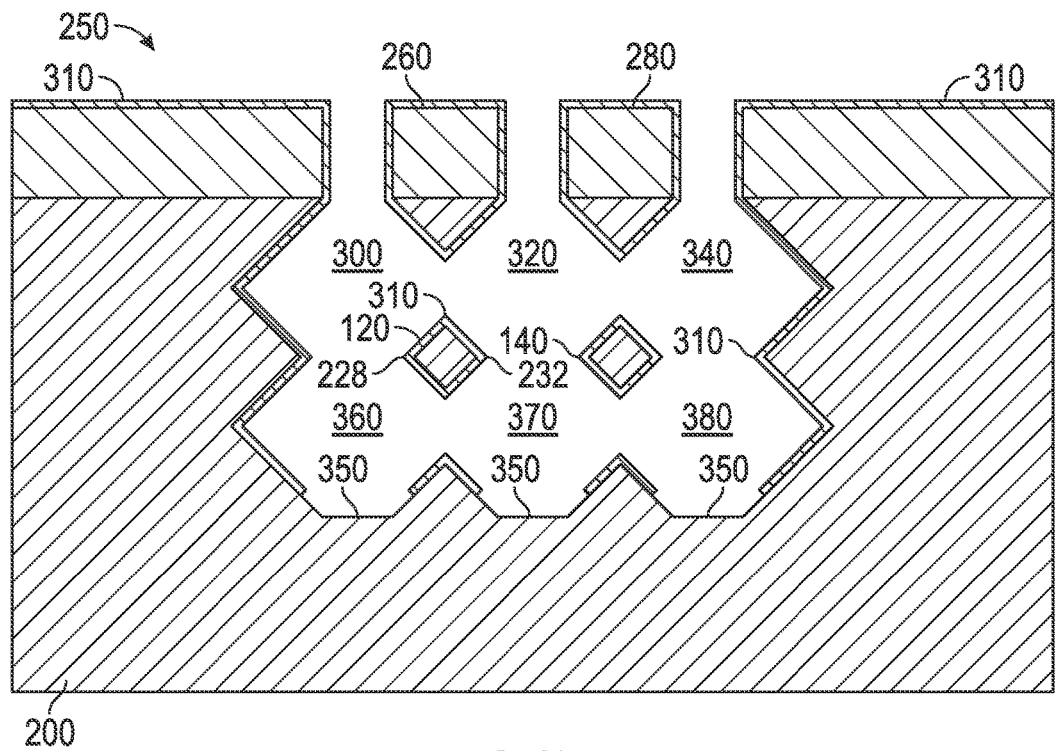
Figure 13:
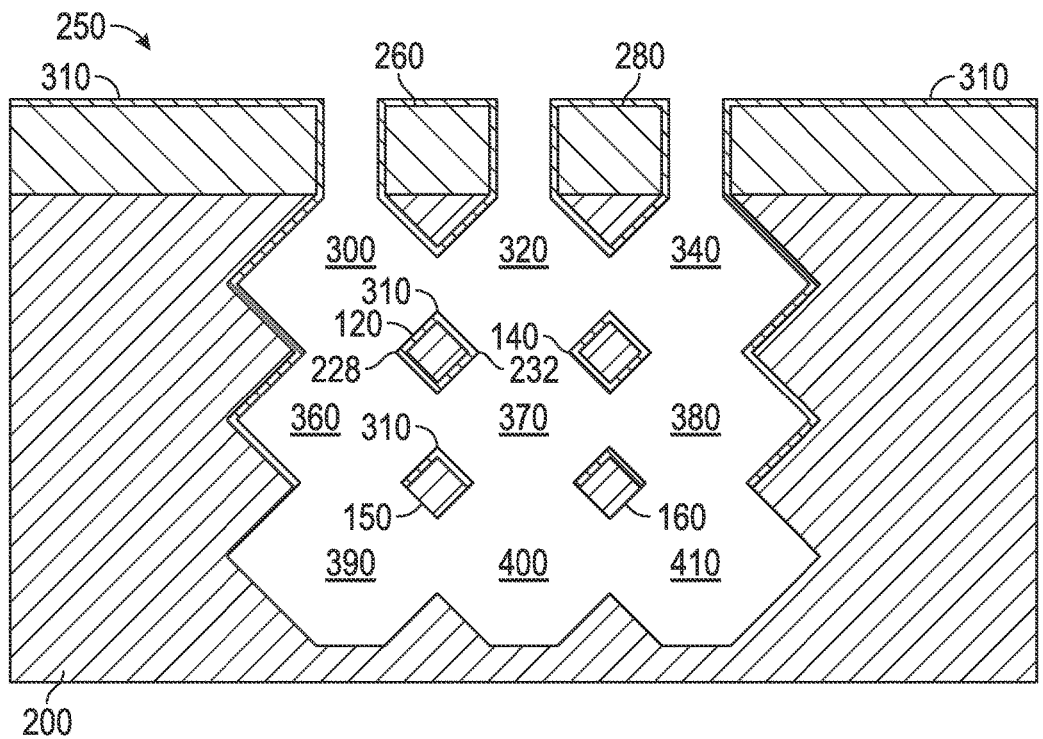
Figure 14:
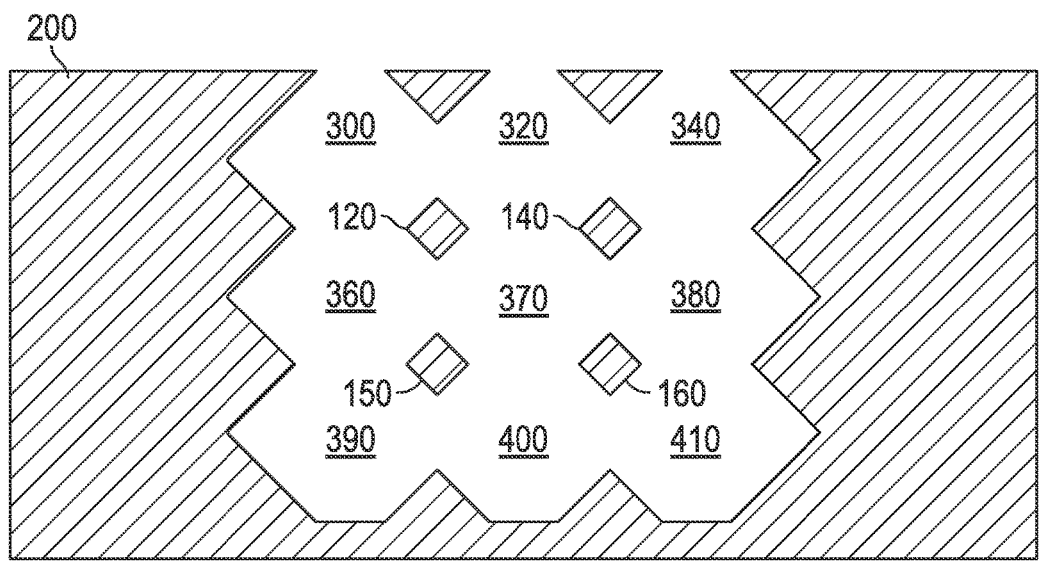

Referring to FIGS. 11-14, the protective layer 310 can be reapplied, as described above, to cover the cavities 360, 370, and 380 as well as the exposed portions of nanowires 120 and 140 as depicted in FIG. 11. Alternatively, the previous protective layer 310 can be removed prior to re-application. Referring to FIG. 12, another portion or a second portion 350 of the protective layer 310 can be removed at the bottom of the cavities 360, 370, and 380. Afterwards, a seventh cavity 390, an eighth cavity 400, and a ninth cavity 410 may be formed underneath and communicate with, respectively, cavities 360, 370, and 380 as depicted in FIG. 13. Two more nanowires can be defined, namely the nanowires 150 and 160. In this exemplary embodiment, the cavities 360, 370, 390, and 400 define the nanowire 150 and the cavities 370, 380, 400, and 410 define the nanowire 160. Referring to FIG. 14, the semiconductor substrate 200 can be cleaned, using any suitable technique, such as chemical-mechanical polishing, leaving the nanowires 120, 140, 150, and 160 within the semiconductor substrate 200.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. An integrated circuit, comprising:
   a gate side;
   a source side;
   a drain side;
   a bulk side; and
   first and second nanowires, wherein the first and second nanowires are aligned substantially vertical to form a first vertical stack, wherein each of the first and second nanowires has a first end at the source side and a second end at the drain side and define a distance of no more than about 28 nm, and wherein each of the source side, the drain side, the bulk side, the first nanowire, and the second nanowire all comprise a single semiconductor material that derives from a single semiconductor substrate.

2. The integrated circuit of claim 1, further comprising third and fourth nanowires, wherein the third and fourth nanowires are aligned substantially vertical to form a second vertical stack, wherein the first vertical stack and the second vertical stack are aligned parallel with one another, wherein each of the third and fourth nanowires has a first end at the source side and a second end at the drain side and define a distance of no more than about 28 nm, and wherein the third and fourth nanowires each comprise the single semiconductor material that derives from the single semiconductor substrate.

\* \* \* \* \*